(12) United States Patent
Thul

(10) Patent No.: US 10,089,907 B2
(45) Date of Patent: Oct. 2, 2018

(54) INTEGRATED WALL-MOUNTED DIGITAL SIGNAGE ASSEMBLY

(71) Applicant: Arizona Precision Sheet Metal, Phoenix, AZ (US)

(72) Inventor: Theodore M. Thul, Phoenix, AZ (US)

(73) Assignee: Arizon Precision Sheet Metal, Phoenix, AZ (US)

( * ) Notice: Subject to any disclaimer, the term of this patent is extended or adjusted under 35 U.S.C. 154(b) by 58 days.

(21) Appl. No.: 15/263,284

(22) Filed: Sep. 12, 2016

(65) Prior Publication Data

US 2018/0075786 A1 Mar. 15, 2018

(51) Int. Cl.
| | |
|---|---|
| *H05K 5/02* | (2006.01) |
| *G09F 9/302* | (2006.01) |
| *G09F 9/30* | (2006.01) |
| *G06F 3/147* | (2006.01) |
| *G09G 5/12* | (2006.01) |

(52) U.S. Cl.
CPC ............ *G09F 9/3026* (2013.01); *G06F 3/147* (2013.01); *G09F 9/30* (2013.01); *H05K 5/0204* (2013.01); *H05K 5/0208* (2013.01); *H05K 5/0226* (2013.01); *G09G 5/12* (2013.01); *G09G 2370/02* (2013.01); *G09G 2370/16* (2013.01); *G09G 2380/06* (2013.01)

(58) Field of Classification Search
CPC .. H05K 5/0204; H05K 5/0208; H05K 5/0226; G09F 9/30; G09F 9/3026
See application file for complete search history.

(56) References Cited

U.S. PATENT DOCUMENTS

| | | | |
|---|---|---|---|
| 8,902,193 B2 | 2/2014 | Hansen et al. | |
| 8,740,164 B2* | 6/2014 | Tachibana | F16M 11/041 248/276.1 |
| 9,712,780 B2* | 7/2017 | Oya | H04N 5/645 |
| 9,865,222 B2* | 1/2018 | Trachtenberg | G09G 5/003 |
| 2003/0217495 A1* | 11/2003 | Nagamine | G09F 9/00 40/605 |
| 2005/0210722 A1 | 9/2005 | Graef et al. | |
| 2006/0109388 A1 | 5/2006 | Sanders et al. | |

(Continued)

FOREIGN PATENT DOCUMENTS

CN 101661172 3/2010

OTHER PUBLICATIONS https://www.youtube.com/watch?v=6o9plSLdBgl.

(Continued)

*Primary Examiner* — Hoa C Nguyen
*Assistant Examiner* — Keith Depew
(74) *Attorney, Agent, or Firm* — Jennings, Strouss & Salmon PLC; Michael K. Kelly; Daniel R. Pote

(57) ABSTRACT

Systems, devices, and methods for a digital signage display assembly. The display assembly includes: a bracket configured to be attached to a wall; a display module configured to be releasably attached to the bracket; a bezel configured to secure the display to the bracket; and a connector module comprising a display-side component affixed to the display, a bracket-side component affixed to the bracket, and a bezel-side connector affixed to the bezel; wherein the bracket-side component is configured for releasable electrical and mechanical engagement with the display-side component.

14 Claims, 11 Drawing Sheets

(56) References Cited

U.S. PATENT DOCUMENTS

| | | | | |
|---|---|---|---|---|
| 2008/0141572 | A1* | 6/2008 | Tomich | G09F 9/30 |
| | | | | 40/605 |
| 2011/0101185 | A1* | 5/2011 | Kitaguchi | F16M 11/048 |
| | | | | 248/222.14 |
| 2012/0092377 | A1* | 4/2012 | Stein | F16M 11/041 |
| | | | | 345/649 |
| 2013/0087655 | A1 | 4/2013 | Lostoski et al. | |
| 2014/0347262 | A1* | 11/2014 | Paek | G09G 3/20 |
| | | | | 345/156 |
| 2014/0366164 | A1 | 12/2014 | Hoefgen et al. | |
| 2015/0062206 | A1* | 3/2015 | Osborne | G09G 5/00 |
| | | | | 345/698 |
| 2016/0210886 | A1* | 7/2016 | Brashnyk | G09F 9/3026 |
| 2016/0371047 | A1* | 12/2016 | Cope | C23C 14/562 |

OTHER PUBLICATIONS

International Search Report, PCT/US17/051161 dated Jan. 8, 2018; 4pgs.
Written Opinion, PCT/US17/051161 dated Jan. 8, 2018; 5pgs.

\* cited by examiner

INTEGRATED WALL-MOUNTED DIGITAL SIGNAGE ASSEMBLY

TECHNICAL FIELD

The present invention relates, generally, to a connector architecture for distributing power and data in a wall-mounted display and, more particularly, to an integrated assembly including a mounting bracket, a display panel, and a replaceable bezel.

BACKGROUND

Commercial and industrial video displays used in advertising and promotion, also referred to as digital signage, may comprise one or more individual display terminals or a cluster of displays operating as a video wall. Many displays include a PC or dedicated video player, while "smart" displays eliminate the PC by incorporating the player functionality directly into a single display chip. Smart displays thus require only a power connection, one or more data connections such as an internet connection (e.g., LAN/WIFI), and smart software such as Signagelive™ scheduling software for uploading, scheduling, and displaying content. Digital content may be displayed full screen or using any number of multi-zone templates.

The Flat Display Mounting Interface (FDMI), also known as the VESA Mounting Interface Standard (MIS) or simply as VESA mount, is a family of standards defined by the video electronics standards association (VESA) for mounting displays. VESA defines both a close-to-the-wall mounting configuration, and a spaced-apart mounting configuration which allows the coaxial and/or HDMI cables to extend orthogonally rearward, while providing sufficient clearance for the cords to bend 90 degrees and routed away from the device parallel to the wall. In addition, presently known video wall mounting configurations allow an individual display to be pulled away from the wall while remaining parallel to the wall for maintenance purposes.

Presently known wall mounted digital signs require manually inserting power and data connectors either into the back or a side edge of the display and/or associated player (e.g., PC), and routing the associated wiring so that it is out of view. This is cumbersome and in many jurisdictions may require a licensed electrician for installation and service. State of the art video walls, such as those available from Ventuz™ (See, https://www.youtube.com/watch?v=609pISLdBgI) require extensive cable connections from power sources and servers to the displays. Consequently, replacing a component in a single display in a video wall often requires the entire wall to be off-line for many hours.

Presently known digital signage installation and maintenance is thus cumbersome, labor intensive, aesthetically challenging, and susceptible to physical and electronic intrusion (hacking).

Moreover, scheduling and otherwise coordinating the distribution and display of content and deployment of maintenance personnel is currently ad hoc.

Improved digital signage mounting and operational architectures are thus needed which overcome the foregoing limitations.

BRIEF SUMMARY

The present invention relates to an improved mechanical mounting architecture and system level control architecture for wall-mounted digital signage, and associated installation, maintenance, and content distribution methods. Various embodiments of the invention contemplate: i) an integrated display assembly including a mounting bracket (also referred to herein as a backplane), a display module, and a bezel for supporting peripheral devices and artwork and for securing the display between the bracket and the bezel; ii) an integrated power and data connector configured to mechanically and electrically mate with the backplane, display, and bezel for providing power to the display and bezel, for providing content to the display, and for providing data to and from the bezel; iii) a pivot, hinged, or sliding mechanism for guiding the display-side connector into engagement with the bracket-side connector; iv) one or more floating bezel-side connectors for exchanging data and control signals between the bezel and a central hub via the integrated data connector; v) a remotely actuable locking mechanism for selectively securing and releasing the bezel from the bracket to thereby permit controlled authorized access to the display; vi) a radio module contained within or mounted to the display chassis for providing content to the display and facilitating control signals and data flow between the bezel and a central portal; vii) a cellular network between each display and the administrative portal which mitigates or eliminates wires except power for stand-alone and video walls, without compromising content, data, and feature management, all with enhanced security; viii) centralized management and control of all aspects of any number of displays at any number of locations integrated into a single GUI running on a hub device; ix) content and scheduling control and maintenance of displays to thereby reduce the total cost of ownership; x) "big data" capture and storage of sensor data retrieved from bezel peripheral devices; xii) rapid deployment of a comprehensive internet of things (JOT) network; xiii) replacement bezels configured to allow the attachment of cardboard decorations, motorized artwork, electronic devices, and the like with plug-and-play installation; xiv) remote validation that the correct content and bezel peripherals are being displayed at the correct kiosk(s) at the assigned time/date, along with auditable proof of same; xv) real time alerts to the central hub of maintenance issues detected prior to component failure (e.g., vibration sensors detecting impending motor failure); portal GUI configured to alert the administrator as to which displays need attention, scheduling the installation and replacement of artwork/bezels, and facilitating the movement of inventory and routes for optimum maintenance personnel based on proximity and availability of inventory; and xvi) a central authority for controlling both access and content for a plurality of displays.

Various other embodiments, aspects and features of the present invention are described in more detail below. Additional features and characteristics will become apparent from the subsequent detailed description and the appended claims, taken in conjunction with the accompanying drawings and this background section.

BRIEF DESCRIPTION OF THE DRAWING FIGURES

Exemplary embodiments will hereinafter be described in conjunction with the following drawing figures, wherein like numerals denote like elements, and:

DETAILED DESCRIPTION OF PREFERRED EXEMPLARY EMBODIMENTS

The following detailed description is merely exemplary in nature and is not intended to limit the invention or the application and uses of the invention. Furthermore, there is no intention to be bound by any theory presented in the preceding background or the following detailed description.

Installing, repairing, replacing, and controlling digital signage components, and particularly the display monitor, can be cumbersome and labor intensive because of the need to manually plug in various connections for supplying power, data, and the like to the display. Large scale video walls employing vanishingly thin bezels exacerbate this difficulty due to the compact configuration of the cluster. Various embodiments of the present invention provide a modular plug-n-play configuration using standardized connector architecture for supplying power and data to the display which avoids shared wiring, as well as "slot machine" type software which facilitates on-the-fly replacement of display components such that the newly installed parts may be deployed immediately upon installation.

In a preferred embodiment, power may be supplied to the display through mating connectors disposed on both the display and the mounting bracket (also referred to as a backplane), while controlling physical access to the inside of the assembly by actuating a locking mechanism associated with a bezel which surrounds the display module and the mounting bracket. Content to be displayed on the display terminal, as well as control signals and data from and to the bezel, are sent and received through an on board radio associated with the display module.

Figure 1:
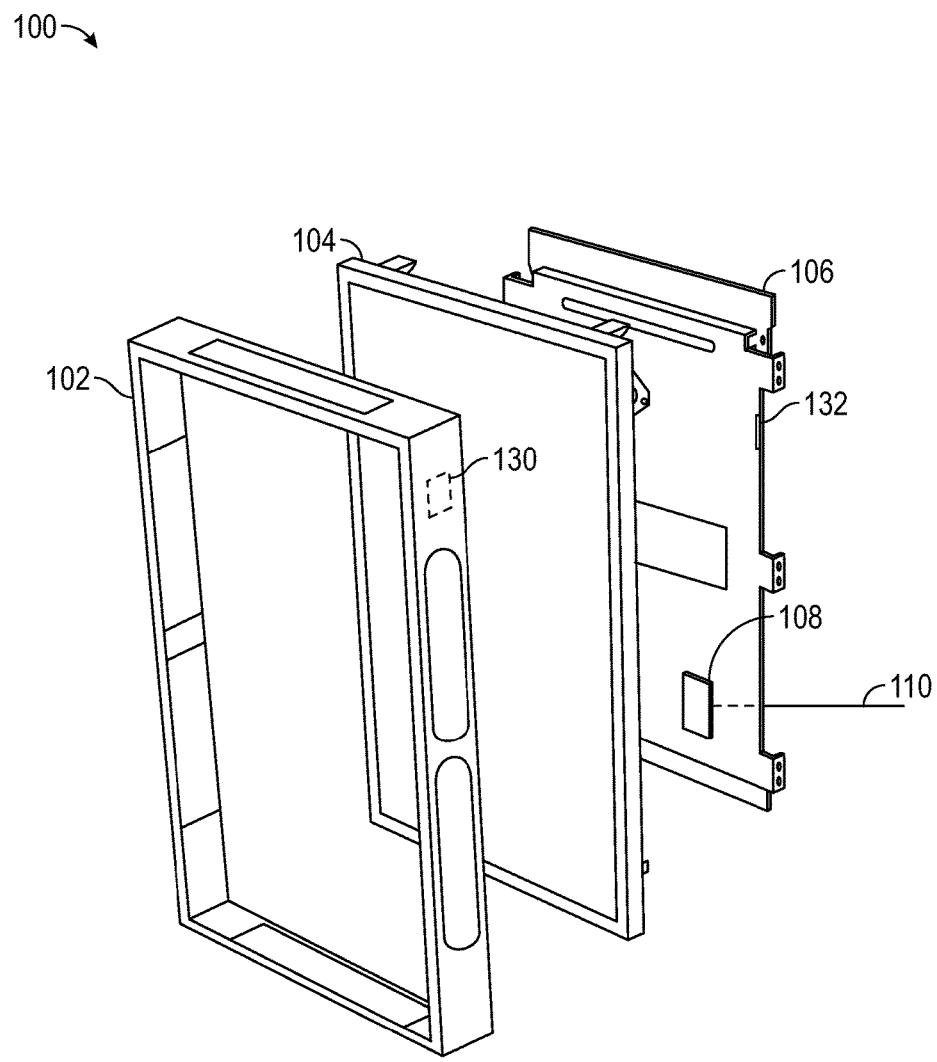
FIG. 1 is an exploded perspective view of an exemplary display assembly including, from left-to-right, a bezel, a display panel, and a mounting bracket in accordance with various embodiments.

Referring now to FIG. 1, an exemplary digital signage assembly 100 includes, from left-to-right, a bezel 102, a display panel 104, and a mounting bracket 106 having an integral connector 108. The connector 108 is attached to a communication corresponding connector (not shown in FIG. 1) disposed on the back of the display 104, such that the two connectors mechanically and electrically engage when the display is mated with the bracket during installation. In this way, the display may be installed and/or replaced without having to separately attach cables to the display. Those skilled in the art will appreciate that the conductor no may be routed behind the wall or frame structure to which the bracket 106 is mounted to provide power to the assembly while maintaining an aesthetically pleasing appearance.

Figure 2:
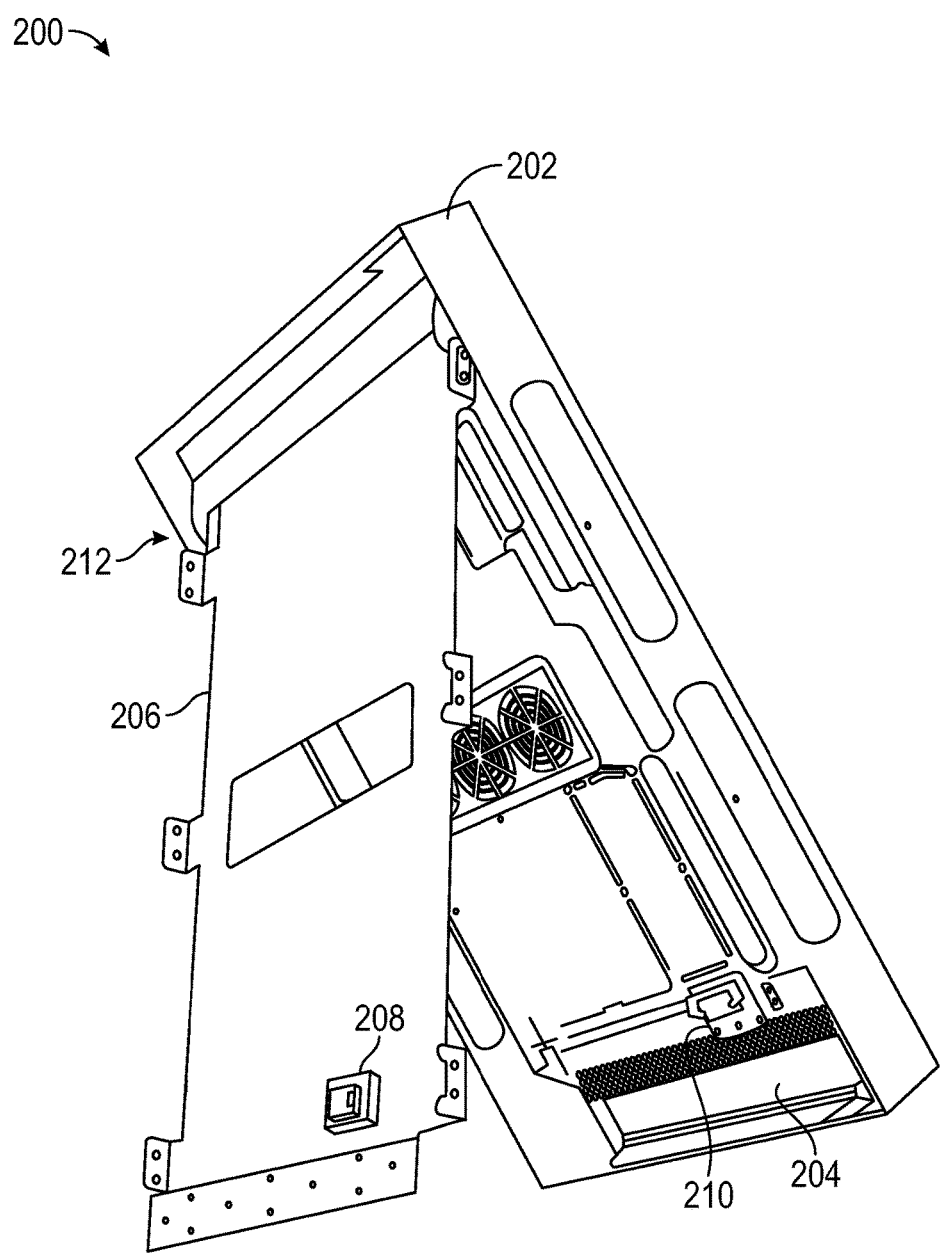
FIG. 2 is a perspective view of an exemplary display assembly showing the display module and attached bezel hingedly connected to a backplane bracket in accordance with various embodiments.

With reference to FIG. 2, an integrated display assembly 200 includes a bezel 202, a display module 204, and a wall mounting bracket 206 having a connector through-hole 208 for receiving a bracket-side connector (not shown in FIG. 2). The display module 204 is hingedly connected to the top (or bottom or side) of the bracket 206, such that when the display pivots about a hinge 212, the bracket-side connector is brought into mechanical and electrical engagement with a corresponding mating connector 210 associated with the display to thereby provide power (and/or data) to the display.

Figure 3:
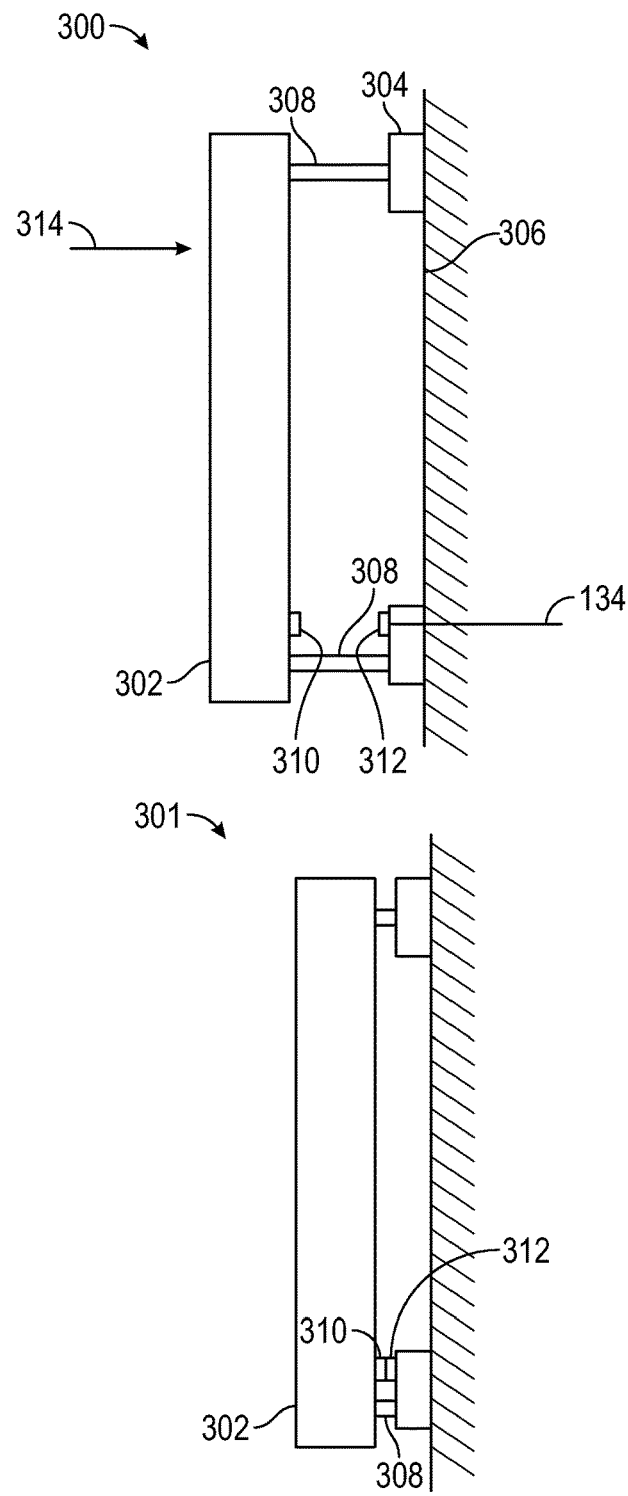
FIG. 3 is a side view of an exemplary display module slidably connected to a backplane bracket in accordance with various embodiments.

FIG. 3 is a side view of an alternative embodiment of an integrated digital signage assembly in which the display and backplane remain essentially parallel as they (along with their respective connectors) slide into and out of engagement with each other. The left side of FIG. 3 depicts a display assembly in the extended (pulled away from the wall) position 300, and the right side of FIG. 3 depicts a display assembly in the closed (pushed up against the wall) position 301. In particular, the assembly includes a display 302, a mounting bracket 304 secured to a wall 306, and a rolling or sliding mechanism 308 which allows the display 302 to be selectively urged toward and away from the wall along the arrow 314.

With continued reference to FIG. 3, the display module 302 includes a display-side connector 310, and the bracket includes a corresponding bracket-side connector 312. In the illustrated embodiment, the connector 312 may be configured to provide power to the display from one or more wires or cables 134 which may be concealed behind the wall 306 and discretely routed to the connector 312. When the display is moved to the right along arrow 314 such that respective connectors 310, 312 are moved into engagement, preconfigured (e.g., standardized) connections on the connectors are coupled together to provide electrical power from the wire 134 to the display and, as explained below, to an associated bezel and peripheral devices supported by the bezel.

In an embodiment, the assembly includes two internal locks; i) a first connector lock analogous to the lock associated with plugging a power supply into the back of a server, where a spring component snaps into place to prevent unintended removal; and ii) a second lock for intrusion prevention, integrated into the bezel and backplane to control authorized access and prevent unauthorized access to the display assembly (discussed in greater detail below).

In accordance with one aspect of the invention, the bezel may be either passive or active; that is, in the active mode power and/or data me be supplied to the bezel through mating connectors generally analogous to the display-side and bracket-side power/data connectors discussed above. More particularly and with momentary reference to FIG. 1, a first, bezel-side connector 130 may be configured to mate with a corresponding second, bracket-side connector 132 associated with the mounting bracket. When the bezel is installed over the display and the display mated with the backplane bracket, the connectors 130, 132 are moved into mechanical and electrical contact with each other to thereby provide power and/or data from and to the bezel, as appropriate. By way of non-limiting example, power and/or data may be supplied to the bezel to support associated speakers, cameras, lights, microphones, motion detectors, vibration and other sensors, playback of audio content, and the like.

Figure 4:
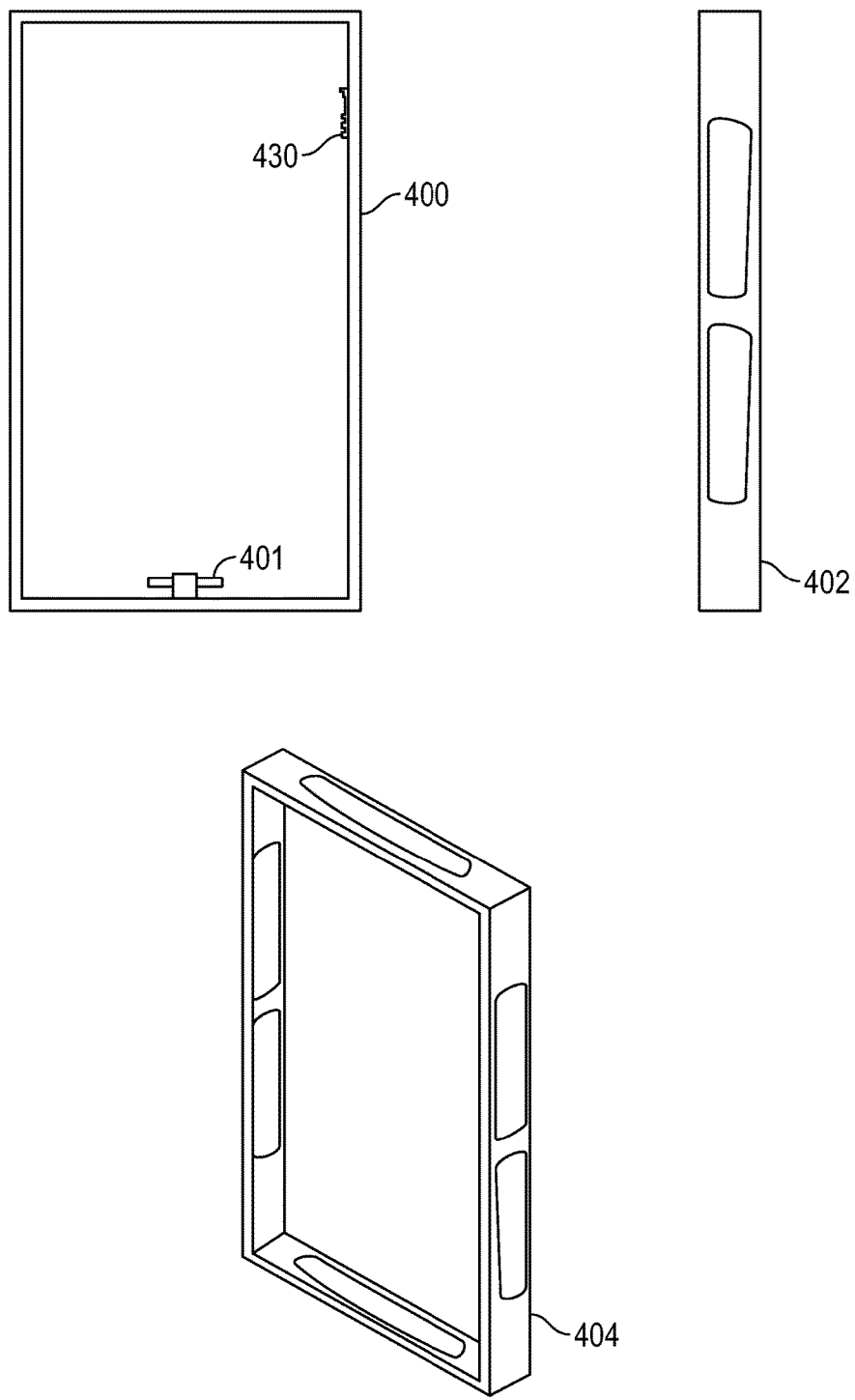
FIG. 4 depicts front, side, and perspective views, respectively, of an exemplary bezel in accordance with various embodiments.

FIG. 4 illustrates a front vie 400, a side view 402, and a perspective view 404 of an exemplary bezel including a bezel-side connector 430 and respective locks (e.g., locking pins) 401. The locks 401 may me electromechanical, and may extend from the backplane into engagement with the bezel, from the bezel into the backplane, or otherwise engage the bezel, display, and/or backplane in such a manner as to lock the entire assembly together to prevent intrusion when in a locked position, and to permit access to the inside of the assembly when in an unlocked position.

Figure 5:
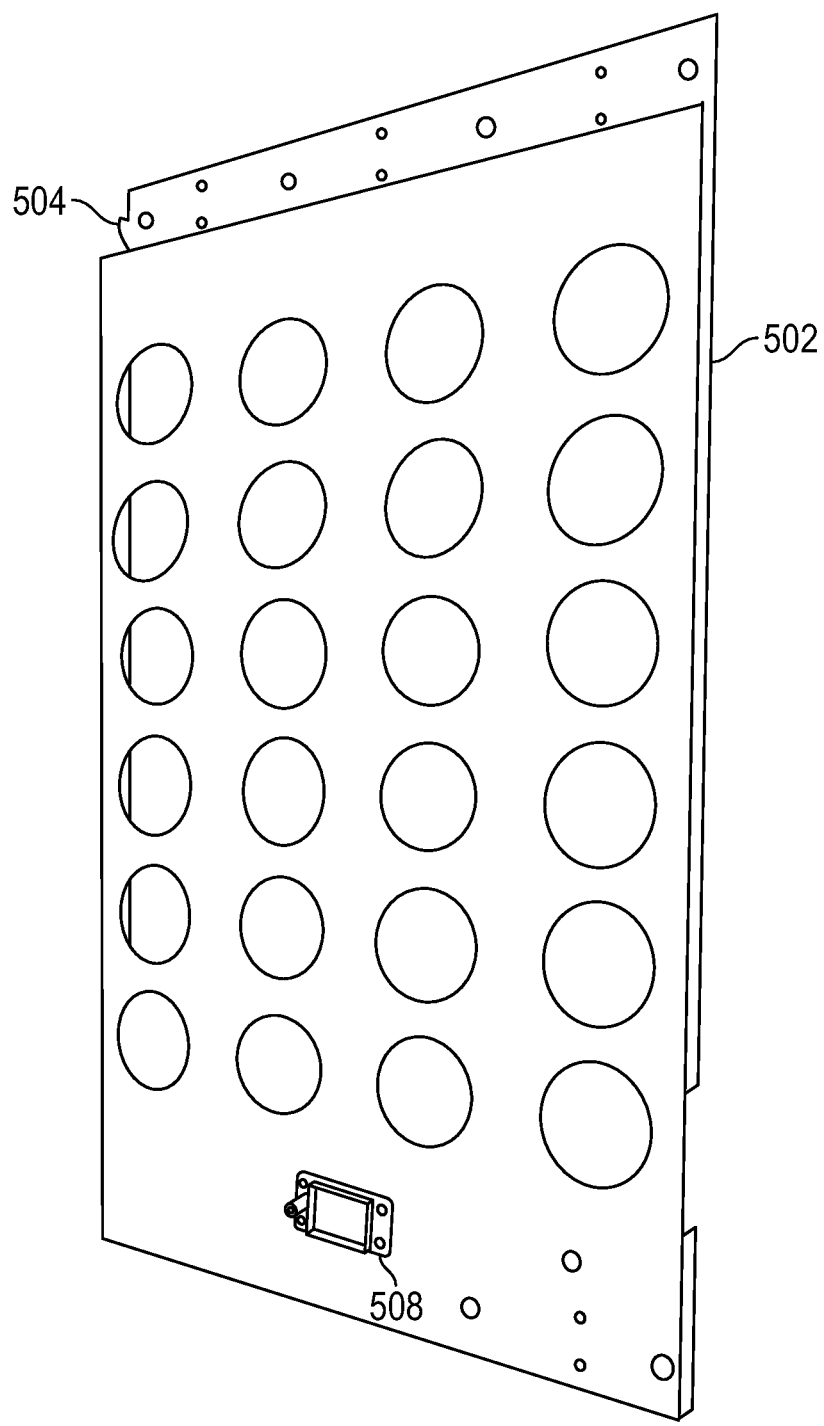
FIG. 5 is a perspective view of an exemplary backplane shown mounted to a wall depicting a bracket-side display connector and associated pin guide, a bracket-side bezel connector, and hinge hooks in accordance with various embodiments.

Referring now to FIG. 5, a backplane 502 includes hinges or hooks 504 or any other suitable mechanism to allow a display module to pivot about, hang from, or otherwise permit a display to be selectively secured to and removed from the backplane. The backplane 502 further includes a bracket-side display connector 508. In a preferred embodiment, an external power cord connects to the connector 508 to supply power to the display module and bezel. As described in greater detail below in conjunction with FIGS. 9-11, one advantage of the present invention is that the property on which the displays are installed need only supply power to the device; all other data, content, and control signals are coordinated through a wireless (e.g., cellular) network, virtually eliminating the need for external wires, cables, and the like.

Figure 6:
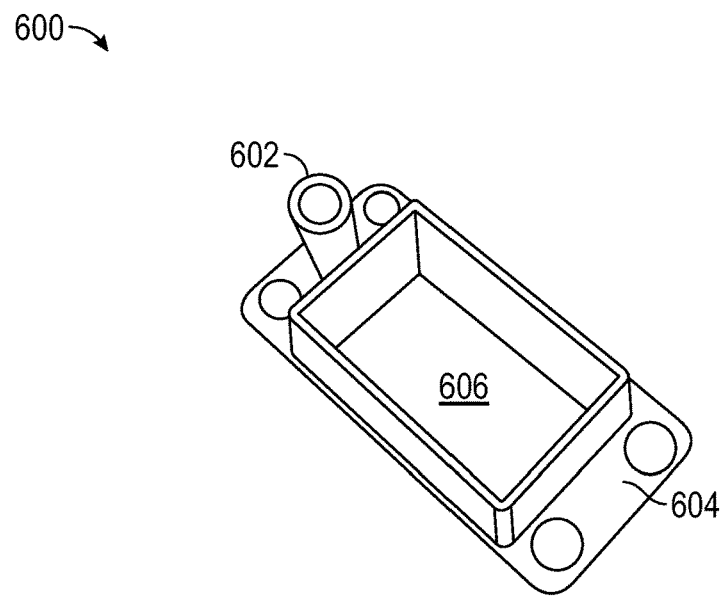
FIG. 6 is a close-up view of the bracket-side connector shown in FIG. 5 in accordance with various embodiments.

FIG. 6 is a close-up view of the bracket-side connector boo of the type shown in FIG. 5, showing a female pin guide receptor 602, a male pin guide 604, and a connector chassis region 606 for supporting data connection switches and hardware.

Figure 7:
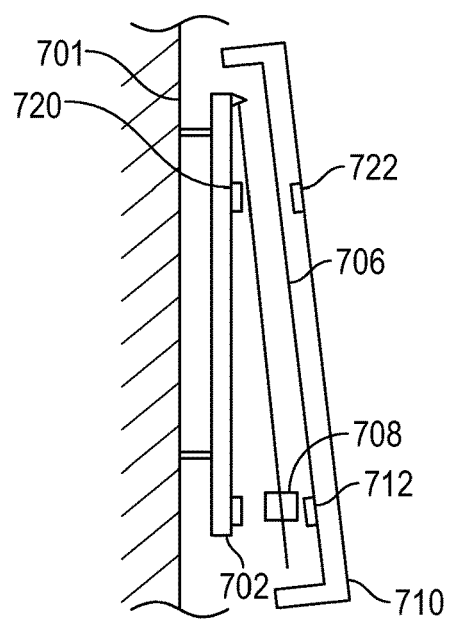
FIG. 7 is a schematic cross-section view of an exemplary integrated display assembly showing a backplane connector, a display connector, and a bezel connector in accordance with various embodiments.

FIG. 7 is a schematic cross-section view of an exemplary integrated display assembly 700 illustrating a data communication architecture implemented in a plurality of interconnected conductor assemblies referred to herein as connectors. More particularly, the assembly 700 includes a backplane (bracket) 702 mounted to a wall 701 and having a bracket-side connector 704, a display module 706 having a display-side connector 708, and a bezel 710 having one or more bezel-side connectors 712. Alternatively, the bezel may include one or more connectors 722 configured to mate with a corresponding connector 720 on the bracket. As discussed in greater detail below, various embodiments of the bezel may be configured to provide intrusion protection, as well as supporting one or more active components such as, for example, a speakers, microphones, LEDs, motorized components, and various sensors for sensing motion, light, vibration, temperature, barometric pressure, precipitation, proximity, facial recognition, crowd counting, tactile/haptic reception and feedback, and the like.

With continued reference to FIG. 7, the bezel-side connector 712 may be disposed in a single location proximate the display-side connector. Alternatively, any number of bezel-side connectors may be disposed in any location on, within, or otherwise associated with the bezel and configured to communicate with one or more mating connectors on the display and/or the backplane. In an embodiment, the bezel connector(s) may comprise self-aligning ("floating") magnetic connectors for transmitting power and control signals to the bezel, and for communicating data between the bezel and the display module, as described in greater detail below. The assembly may be configured such that the peripheral devices supported by the bezel are activated when the bezel is locked to the backplane, as also described more fully below.

Figure 8:
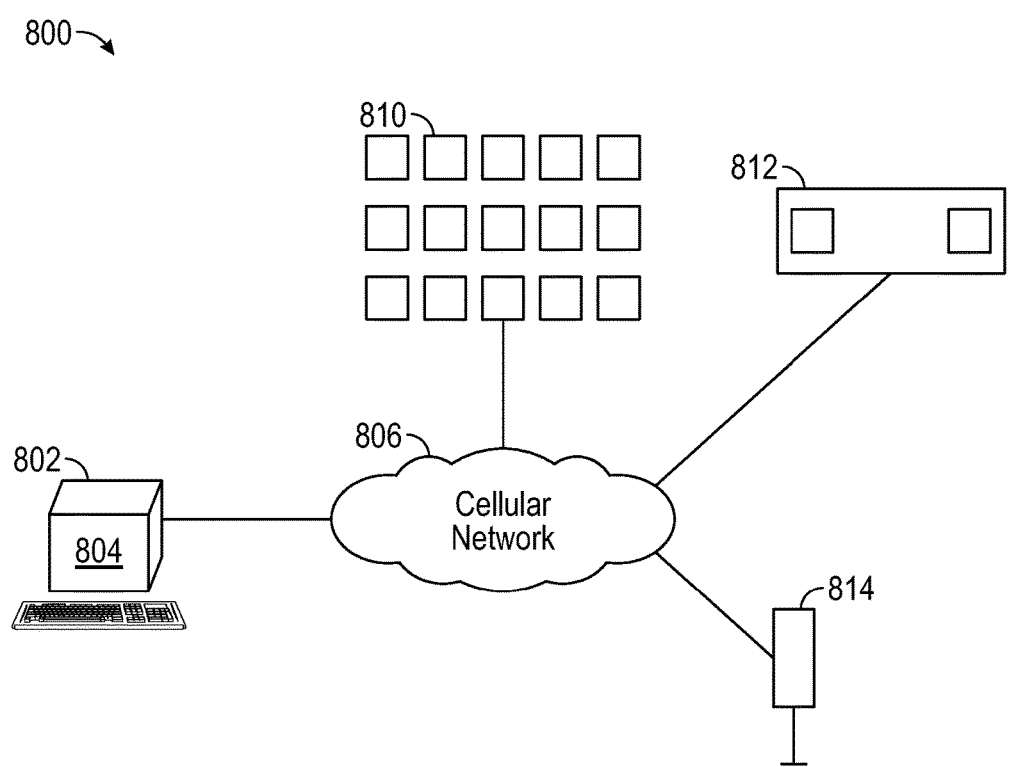
FIG. 8 is a schematic layout view of a control system for managing remote displays including a central data center or hub, a wireless network, and various remote displays in accordance with various embodiments.

Referring now to FIG. 8, a control system 800 for managing remote displays includes a central data center or hub 802 running a graphical user interface (GUI) 804 for scheduling installation, maintenance, and uploading content to the display, as well as receiving data and information from and controlling peripheral devices and sensors associated with an active bezel. The portal 802 may be configured to communicate with remote displays through a wireless network 806, such as a cellular or WiFi network. The various remotely controlled devices may include a video wall 810, wall mounted displays 812, free-standing displays 814, and virtually any other remote electronic device or group of devices of any kind or nature exhibiting any type of functionality. In a preferred embodiment, the devices may be equipped with a wireless transceiver, such as a cellular radio, as described in greater detail below in conjunction with FIGS. 9-11. In embodiments where two or more are clustered together, each display may include its own radio; alternatively, a single radio may be shared among multiple displays.

Figure 9:
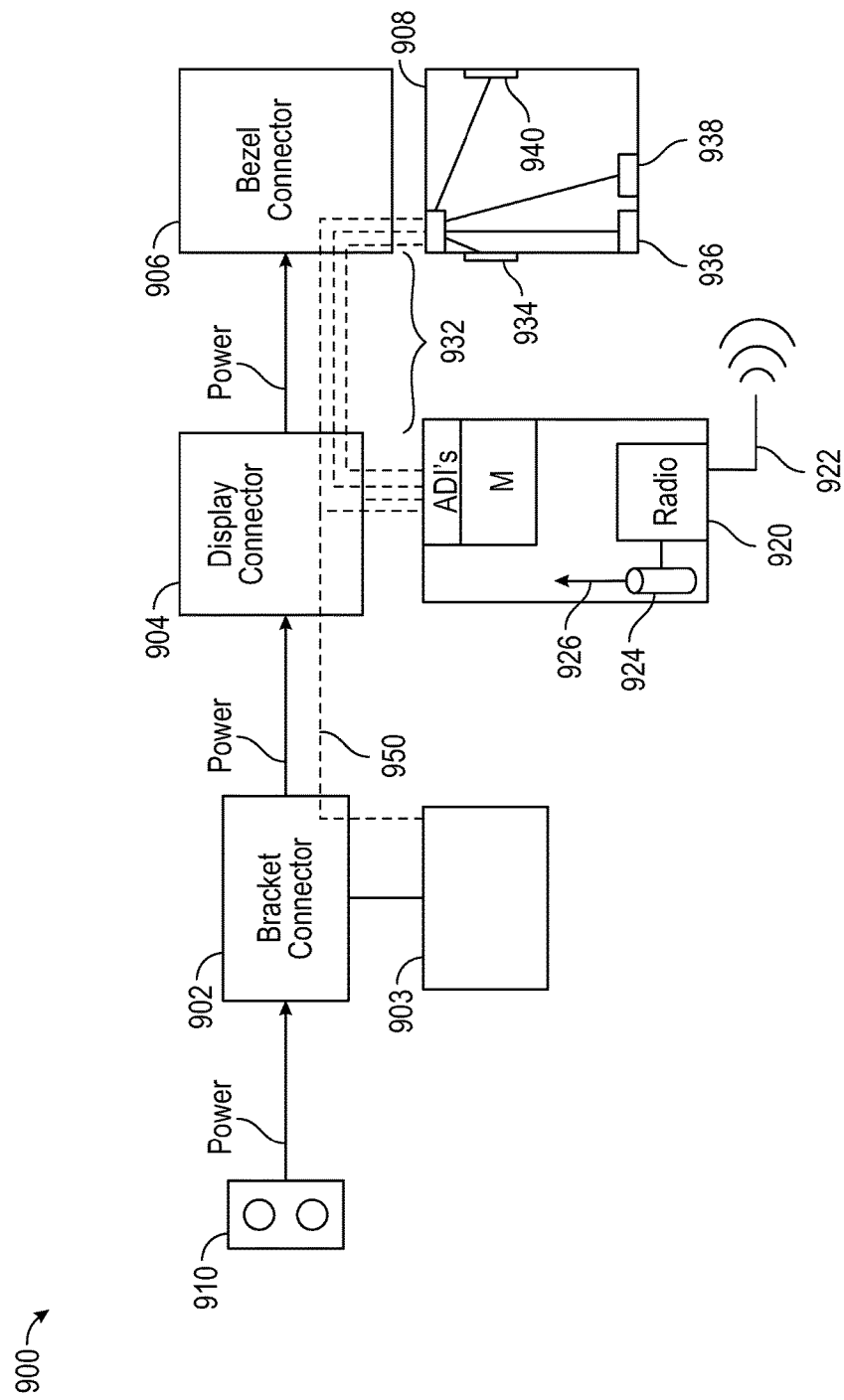
FIG. 9 is a schematic layout view of an exemplary system illustrating data flowing to and from an active bezel using an integrated connector architecture in accordance with various embodiments.

FIG. 9 is a schematic layout view of an exemplary connector system 900 illustrating data flowing to and from an active bezel using an integrated connector architecture in accordance with various embodiments. In particular, the connector system 900 includes a bracket-side connector 902 associated with a backplane (not shown) having a lock 903, a display-side connector 904 associated with a display 905, and a bezel-side connector 906 associated with a bezel 908. Power is supplied to all three connectors and their associated devices from a power source 910 using, for example, a conventional power plug 912.

With continued reference to FIG. 9, the display 905 includes a radio transceiver 920, an antenna 922, a data storage unit 924, and data port 926 for supplying content to the display terminal (not shown). The display 905 further includes a motherboard 928 and a serial port 930 supported by application programming interfaces (APIs). The serial port communicates with a plurality of communication channels 932 supported by the display-side connector 904 and the bezel side connector 906. The communication channels 932 may terminate at any number of peripherals associated with the bezel 908 such as, for example, LEDs 934, sensors 936 (e.g., vibration, temperature, voice recognition, facial recognition, biometric, barometric), a lock 938, and speakers 940. As described in greater detail below, the lock 903 associated with the backplane and the lock 938 associated with the bezel cooperate to secure the display and bezel to the wall and to prevent intrusion into the display module. For this purpose, a communication channel 950 may extend from the motherboard 928, thru display connector 904 and backplane connector 902, and terminating at the lock 903.

Figure 10:
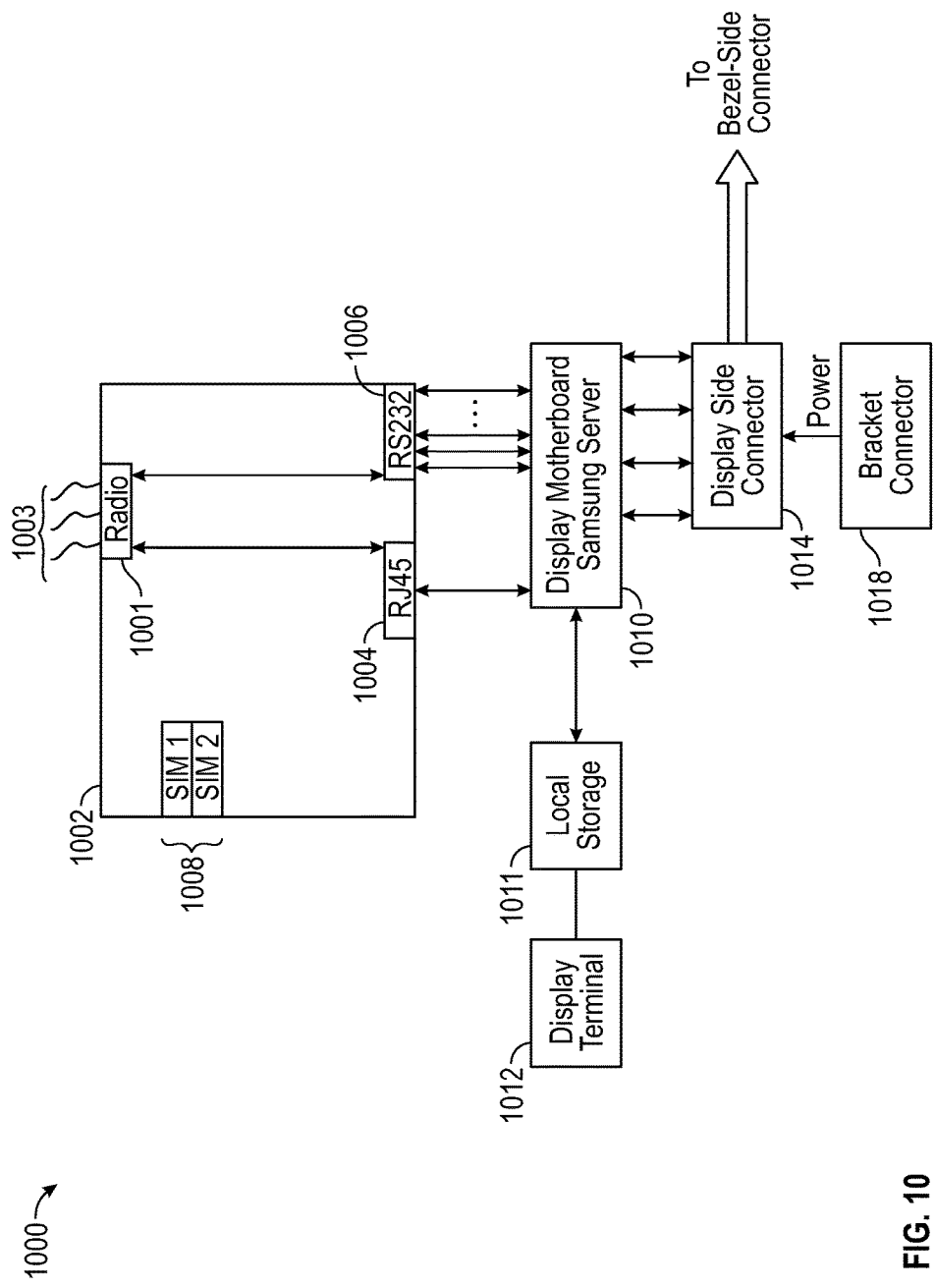
FIG. 10 is a schematic layout view of an exemplary display module including a radio, a mother board, a monitor, and a display-side connector for exchanging data and control signals with a bezel-side connector and a bracket-side connector in accordance with various embodiments.

FIG. 10 is a schematic detailed view of an exemplary display module 1000 including a radio 1002, a mother board 1010, a display monitor 1012, and a display-side connector 1014 configured to exchange data and control signals with a bezel-side connector 1016 and receive power from a bracket-side connector 1018. More particularly, the radio 1002 includes a first communications port 1004 (e.g., and RJ 45 connector) and a second communications port 1006 (e.g., an RS 232 connector) configured to communicate with the display module motherboard 1010, one or more SIM cards 1008 to facilitate cellular communication with an external wireless network, a transceiver 1001 (e.g., a Sierra™ wireless radio), and one or more antennae 1003 (e.g., primary and back-up cellular antennae and a GPS antenna).

With continued reference to FIG. 10, the first communications port 1004 is configured to provide an IP address to the radio 1001, and to provide content to the motherboard for storage in and retrieval from a data storage device 1011 for display on monitor 1012; that is, the RJ 45 connector provides the content "pipe" between the cellular radio and the display. The second communications port 1006 provides the "pipe" between the cellular radio and the bezel (via the display motherboard and display-side connector) for control signals, sensor data, commands, and the like.

In various embodiments, the radio module 1002 may be integrated into the back of the display module in any convenient manner. For outdoor display units, the module may be disposed inside the electronics cavity in compliance with the appropriate IP rating for the device. In this regard, the IP Code (or International Protection Rating, sometimes also interpreted as Ingress Protection Rating) consists of the letters IP followed by two digits and an optional letter. As defined in international standard IEC 60529, the IP rating classifies the degrees of protection provided against the intrusion of solid objects (including body parts like hands and fingers), dust, accidental contact, and water in electrical enclosures. For example, IP-56 corresponds to protection from limited dust ingress (first digit=5), and protection from high pressure water jets from any direction (second digit=6). For indoor units, the radio assembly may simply be attached to the outside skin of the back of the display, as desired.

Figure 11:
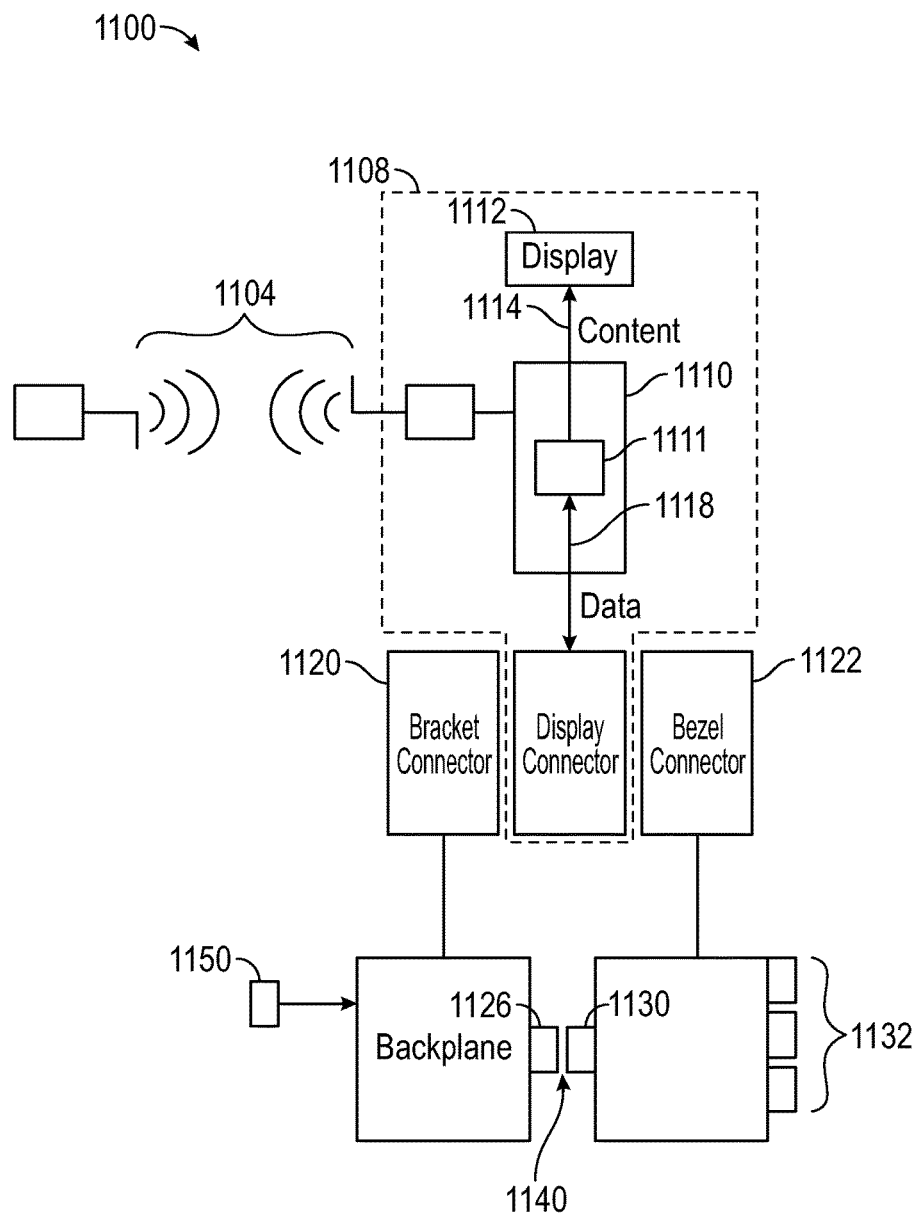
FIG. 11 is a schematic layout view of an exemplary locking mechanism for securing a display and a bezel to a wall mounted backplane in accordance with various embodiments.

FIG. 11 is a schematic layout view of an exemplary locking mechanism 1100 for securing a display and a bezel to a wall mounted backplane. In particular, the locking system 100 includes a central hub or portal 1102 configured to communicate with a radio 1106 associated with a display assembly 1108 through a cellular network 1104. The display assembly 1108 may include a control circuit 1110 having a processor 1111 configured to facilitate transmitting content through a first pipe 1114 to a terminal 1112 for viewing, and to facilitate the exchange of data and control signals through a second pipe 1118 to a display-side connector 1116. The display-side connector, in turn, is configured to mechanically and electrically engage a backplane-side connector 1120 and a bezel-side connector 1122, as variously described above.

With continued reference to FIG. 11, operating electrical power may be supplied to the bezel from a power source (e.g., a conventional electrical wall outlet) 1150 through the backplane-side connector 1120 associated with a backplane 1124, display-side connector 1116, and bezel-side connector 1122. In addition, control signals, such as a command to lock or unlock a locking mechanism 1140 comprising a first lock component 1126 associated with backplane 1124 and a second lock component 1130 associated with bezel 1128, may be sent from the hub 1102 to the bezel in the following manner.

A lock/unlock command may be sent from a graphical user interface (GUI) running on the hub 1102 (mobile phone, tablet, desk top, lap top, or the like) and received by the radio 1106, whereupon the signal is processed by the circuit 1110 and a corresponding instruction packet sent to either the first or second lock component 1126, 1130 (or both). Once the lock/unlock task is completed, a confirming message may be sent back to the hub.

The bezel can be swapped out by unlocking the assembly. The assembly can locally authenticate with password, voice recognition, retinal, any biometric, mag stripe, to handshake and allow access, or simply allow access during a narrow time window.

Big data machine learning can determine when fans are failing based on changes in the vibrational wave; the info is received from the sensor, sent across the RS232 connector, packetized, and sent back to the system admin/data center via the cellular network. Repair prior to fail, decrease cost of ownership once deployed.

The service providers used to install and maintain the units in the field will access our maintenance application. Dispatch the optimum field tech based not just on who may be closest, but also who has the correct part in his van, local warehouse, etc., by cross referencing their inventory dB with our maintenance application.

Figure 12:
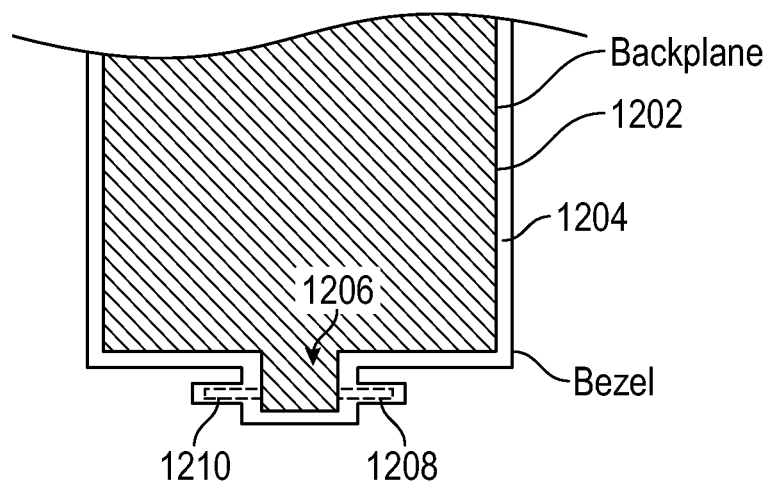
FIG. 12 is a close up view of an exemplary lock mounted to a backplane and having extendable pins configured to engage a bezel in accordance with various embodiments.

FIG. 12 is a close up view of an exemplary lock actuator mounted to a backplane and having extendable pins configured to engage a bezel in accordance with various embodiments. More particularly, a backplane 1202 includes a lock 1206 which, in the illustrated embodiment, comprises opposing retractable pins 1208 configured to extend into corresponding female receptor cylinders 1210 within a bezel 1204. That is, when locked, the extended pins prevent the bezel and backplane from being separated, securing the display panel therebetween. When unlocked, the pins 1208 retract back into the lock housing 1206 (for example, using a servo motor) and release the bezel form the backplane, permitting access to the display assembly.

Figure 13:
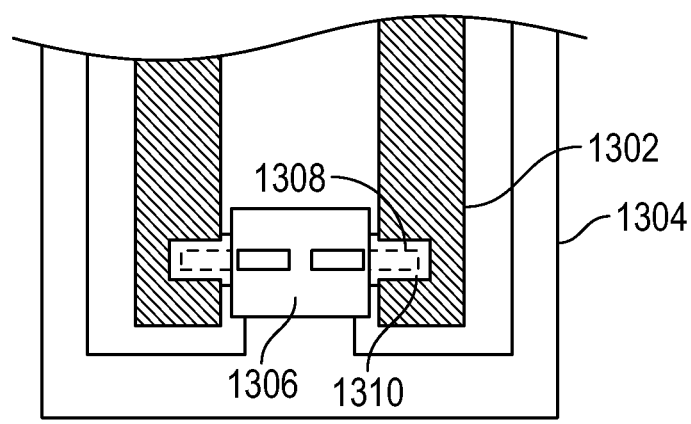
FIG. 13 is a close up view of an exemplary lock mounted to a bezel and having extendable pins configured to engage a backplane in accordance with various embodiments.

FIG. 13 is a close up view of an exemplary lock mounted to a bezel and having extendable pins configured to engage a backplane. More particularly, a bezel 1304 includes a lock 1306 which, in the illustrated embodiment, comprises opposing retractable pins 1308 configured to extend into corresponding female receptor cylinders 1310 within a backplane 1302.

A digital signage display assembly is thus provided including: a bracket configured to be attached to a wall; a display module configured to be releasably attached to the bracket; and a connector module comprising a display-side component affixed to the display and a bracket-side component affixed to the bracket; wherein the bracket-side component is configured for releasable electrical and mechanical engagement with the display-side component.

In an embodiment, the connector module is configured to supply power to the display.

In an embodiment, the connector module comprises a guide pin for guiding the display-side component into mating engagement with the bracket-side component.

In an embodiment, the assembly further comprises a hinge configured to pivotably mount the display to the bracket, the hinge configured to: separate the bracket-side component from the display-side component when the hinge is in an open position; and connect the bracket-side component top the display-side component when the hinge is in a closed position.

In an embodiment, the assembly further comprises a bezel, wherein the connector module further includes a bezel-side connector attached to the bezel.

In an embodiment, the bezel comprises at least one peripheral electronic device.

In an embodiment, the at least one peripheral electronic device comprises one of: LED, audio speaker, temperature sensor, vibration sensor, camera, and microphone.

In an embodiment, the bezel-side connector is configured to receive power from the bracket-side connector and to supply power to the at least one peripheral device.

In an embodiment, the bezel-side connector is configured to receive a control signal from the display-side connector and to apply the control signal to the at least one peripheral device.

In an embodiment, the at least one peripheral device comprises a lock, and the control signal comprises a locking signal.

In an embodiment, the bezel-side connector is configured to receive data signals from the at least one peripheral device and to apply the data signals to the display-side connector.

In an embodiment, the bracket includes a locking mechanism, and the display is configured to transmit a locking signal to the locking mechanism to there lock the bezel to the bracket.

A wall mounted display assembly is also provided, comprising: a bracket having a first communication switch; a display having a second communication switch, the display configured to be selectively suspended from the bracket in one of: i) a first position in which the first communication switch is spaced apart from the second communication switch; and ii) a second position in which the first communication switch electrically and mechanically engages the second communication switch; and a bezel having a third communication switch, the bezel configured to be removably overlaid upon the display such that the third communication switch electrically and mechanically engages the second communication switch.

In an embodiment, the second and third communication switches each comprises multiple spaced apart components.

In an embodiment, the first communication switch is configured to receive power from an external source and to distribute power to the second and third communication switches.

In an embodiment, the bracket comprises a first hinge component and the display comprises a second hinge component configured to pivotable engage the first hinge component to facilitate pivoting the display between the first and second positions.

In an embodiment, the bracket comprises a first lock component and the bezel comprises a second lock component configured to releasable engage the first lock component when the display is in the first position.

A method of installing a wall-mounted digital sign assembly is also provided, the method comprising: providing a bracket having a first hinge portion and a first bracket-side connector; securing the bracket to a wall; plugging a power source into the bracket-side connector; providing a display terminal having a second hinge portion and a display-side connector; attaching the second hinge portion to the first hinge portion to thereby hang the display module from the bracket; and pivoting the display module towards the bracket to thereby mate the display-side connector with the first bracket-side connector to thereby provide power to the display module.

In an embodiment, the method further comprises: providing a bezel having a bezel-side connector; attaching the bezel to the display; and mating the bracket-side connector with a second bracket-side connector on the bracket to thereby supply power and data to the bezel.

In an embodiment, the method further comprises providing a peripheral electronic device on the bezel, such that supplying power to the bezel thereby supplies power to the peripheral electronic device As used herein, the word "exemplary" means "serving as an example, instance, or illustration." Any implementation described herein as "exemplary" is not necessarily to be construed as preferred or advantageous over other implementations, nor is it intended to be construed as a model that must be literally duplicated.

While the foregoing detailed description will provide those skilled in the art with a convenient road map for implementing various embodiments of the invention, it should be appreciated that the particular embodiments described above are only examples, and are not intended to limit the scope, applicability, or configuration of the invention in any way. To the contrary, various changes may be made in the function and arrangement of elements described without departing from the scope of the invention.

What is claimed:

1. A digital signage display assembly comprising:
   a bracket configured to be attached to a wall;
   a display module configured to be releasably attached to the bracket;
   a connector module comprising a display-side component affixed to the display and a bracket-side component affixed to the bracket; and
   a bezel comprising at least one peripheral electronic device, wherein the connector module further includes a bezel-side connector attached to the bezel;
   wherein the bracket-side component is configured for releasable electrical and mechanical engagement with the display-side component;
   wherein the bezel-side connector is configured to receive a control signal from the display-side connector and to apply the control signal to the at least one peripheral device; and
   wherein the at least one peripheral electronic device comprises a lock, and the control signal comprises a locking signal.

2. The assembly of claim 1, wherein the connector module is configured to supply power to the display module.

3. The assembly of claim 1, wherein the connector module comprises a guide pin for guiding the display-side component into mating engagement with the bracket-side component.

4. The assembly of claim 1, further comprising a hinge configured to pivotably mount the display module to the bracket, the hinge configured to:
   separate the bracket-side component from the display-side component when the hinge is in an open position; and
   connect the bracket-side component top the display-side component when the hinge is in a closed position.

5. The assembly of claim 1, wherein the at least one peripheral electronic device comprises one of: LED, audio speaker, temperature sensor, vibration sensor, camera, and microphone.

6. The assembly of claim 1, wherein the bezel-side connector is configured to receive power from the bracket-side connector and to supply power to the at least one peripheral device.

7. The assembly of claim 1, wherein the bezel-side connector is configured to receive data signals from the at least one peripheral device and to apply the data signals to the display-side connector.

8. A digital signage display assembly comprising:
a bracket configured to be attached to a wall;
a display module configured to be releasably attached to the bracket;
a connector module comprising a display-side component affixed to the display and a bracket-side component affixed to the bracket; and
a bezel, wherein the connector module further includes a bezel-side connector attached to the bezel and the bezel comprises at least one peripheral electronic device;
wherein the bracket-side component is configured for releasable electrical and mechanical engagement with the display-side component; and
wherein the bracket includes a locking mechanism, and the display module is configured to transmit a locking signal to the locking mechanism to lock the bezel to the bracket.

9. The digital signage display of claim 8, wherein the connector module is configured to supply power to the display.

10. The digital signage display of claim 8, wherein the connector module comprises a guide pin for guiding the display-side component into mating engagement with the bracket-side component.

11. The digital signage display of claim 8, further comprising a hinge configured to pivotably mount the display to the bracket, the hinge configured to:
separate the bracket-side component from the display-side component when the hinge is in an open position; and
connect the bracket-side component top the display-side component when the hinge is in a closed position.

12. The digital signage display of claim 8, wherein the at least one peripheral electronic device comprises one of: LED, audio speaker, temperature sensor, vibration sensor, camera, and microphone.

13. The digital signage display of claim 8, wherein the bezel-side connector is configured to receive power from the bracket-side connector and to supply power to the at least one peripheral device.

14. A method of installing a wall-mounted digital sign assembly, comprising:
providing a bracket having a locking mechanism, a first hinge portion, and a first bracket-side connector;
securing the bracket to a wall;
plugging a power source into the bracket-side connector;
providing a display module having a second hinge portion and a display-side connector;
attaching the second hinge portion to the first hinge portion to thereby hang the display module from the bracket;
providing a bezel having a bezel-side connector;
providing a peripheral electronic device on the bezel, such that supplying power to the bezel thereby supplies power to the peripheral electronic device;
attaching the bezel to the display module; and
pivoting the display module towards the bracket to thereby mate the display-side connector with the first bracket-side connector to thereby provide power to the display module and mating the bracket-side connector with a second bracket-side connector on the bracket to thereby supply power and data to the bezel;
wherein the display module is configured to transmit a locking signal to the locking mechanism to thereby lock the bezel to the bracket.

* * * * *